United States Patent [19]
Hebert et al.

[11] Patent Number: 5,912,490
[45] Date of Patent: Jun. 15, 1999

[54] MOSFET HAVING BURIED SHIELD PLATE FOR REDUCED GATE/DRAIN CAPACITANCE

[75] Inventors: Francois Hebert, San Mateo; Daniel Ng, Campbell, both of Calif.

[73] Assignee: Spectrian, Sunnyvale, Calif.

[21] Appl. No.: 08/905,513

[22] Filed: Aug. 4, 1997

[51] Int. Cl.$^6$ .................................................. H01L 29/72
[52] U.S. Cl. .................... 257/340; 257/409; 257/365; 257/366
[58] Field of Search ................................. 257/340, 365, 257/366, 409

[56] References Cited

U.S. PATENT DOCUMENTS

| | | | |
|---|---|---|---|
| 5,252,848 | 10/1993 | Adler et al. | 257/328 |
| 5,362,979 | 11/1994 | Merchant | 257/340 |
| 5,445,978 | 8/1995 | Yilmaz | 437/41 |
| 5,672,526 | 9/1997 | Kawamura | 437/41 R |

*Primary Examiner*—Edward Wojciechowicz
*Attorney, Agent, or Firm*—Townsend and Townsend and Crew LLP; Henry K. Woodward

[57] ABSTRACT

Gate to drain capacitance in a lateral DMOS and vertical DMOS field effect transistor is minimized by providing a conductive shield plate under the gate and between the gate and the drain of the transistor. In operation, the shield plate is preferably connected to a DC voltage potential and coupled to AC ground for RF power applications. The shield plate is readily fabricated in a conventional polysilicon gate process by adding one additional polysilicon deposition (or other suitable material), one additional mask, and one additional etch step. The shield plate can include a raised portion which provides lateral capacitive isolation between the gate and the drain. Alternatively, a shield contact can be provided above the shield plate and between the gate and drain to provide lateral isolation.

15 Claims, 29 Drawing Sheets

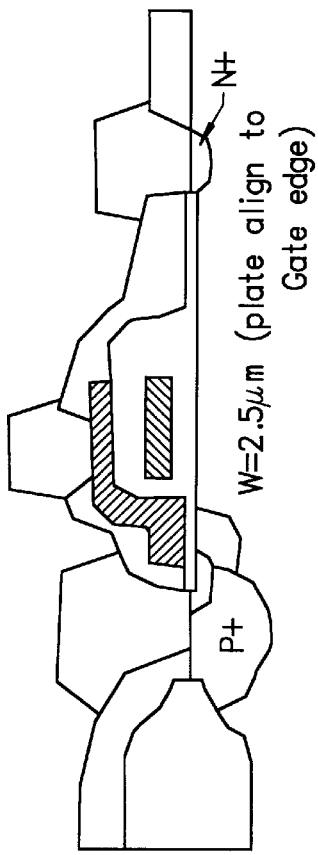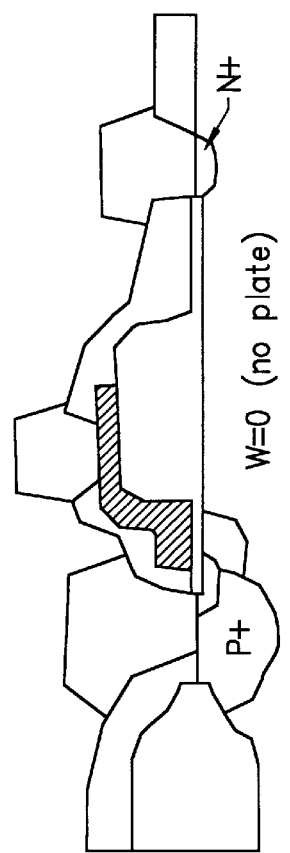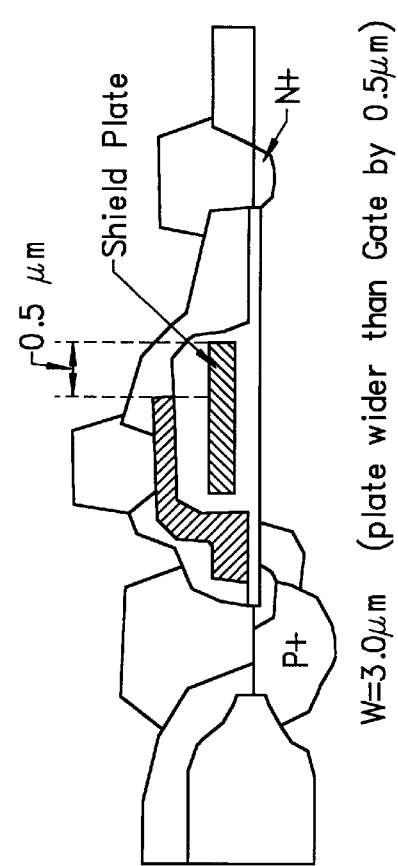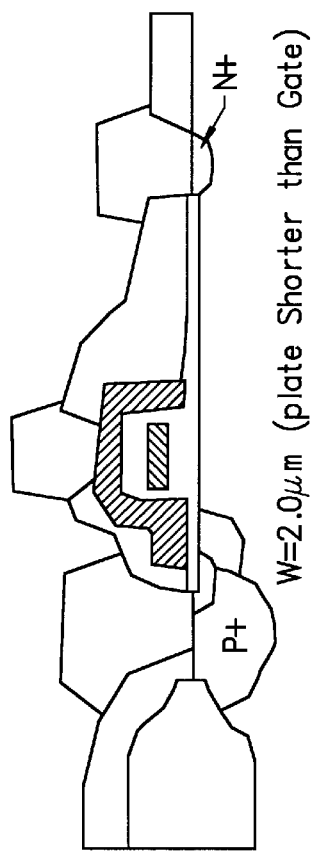
FIG. 16A  W=0 (no plate)
FIG. 16B  W=2.0μm (plate Shorter than Gate)
FIG. 16C  W=2.5μm (plate align to Gate edge)
FIG. 16D  W=3.0μm (plate wider than Gate by 0.5μm)

5,912,490

MOSFET HAVING BURIED SHIELD PLATE FOR REDUCED GATE/DRAIN CAPACITANCE

BACKGROUND OF THE INVENTION

This invention relates generally to insulated gate field-effect transistors (IGFETS), and more particularly the invention relates to reducing gate to drain capacitance in IGFETS including lateral and vertical MOSFETS.

Reduction of gate to drain feedback capacitance ($C_{gd}$ or $Cr_{rss}$) in MOSFET devices is desired in order to maximize RF gain and minimize signal distortion. $C_{gd}$ is critical since it is effectively multiplied by the voltage gain of the device or $C_{effective} = C_{rss}(1+gmR_1)$ where gm is the transconductance and $R_1$ is the load impedance.

Adler et al., U.S. Pat. No. 5,252,848 discloses an FET structure which includes a performance enhancing conductor shield covering the gate electrode and a portion of the drain region of the FET. A description of such a device operating as a 2 GHz RF transistor is in Technical Digest IEDM Conference, 1996, pages 87–90. While the external shield reportedly reduces $C_{gd}$, the dominant component of $C_{gd}$ (gate over drain next to channel) is not shielded. Further, while the external shield is applicable to lateral MOS transistors (LDMOS), the external shield cannot be used with vertical transistors. Additionally, process costs in fabricating such devices can be high.

The present invention is directed to a MOSFET structure having more effective reduction of gate to drain parasitic capacitance.

SUMMARY OF THE INVENTION

In accordance with the invention, a field effect transistor including a lateral MOSFET (LDMOS) and a vertical MOSFET (DMOS) transistor has reduced gate to drain capacitance by providing a buried shield plate underlying the gate and between a gate and drain of the transistor. More particularly, the transistor comprises a semiconductor body having a major surface, a source region of first conductivity type abutting the surface, a drain region of the first conductivity type abutting the surface and spaced from the source region by a channel of a second conductivity type opposite to the first conductivity type, and a gate electrode overlying the channel and part of the drain and insulated therefrom by a dielectric material. The shield plate is formed prior to the gate and is positioned under the gate and between the gate and the drain and is insulated therefrom. The shield plate preferably includes a contact for electrically biasing the shield plate such as by a fixed DC potential and/or an AC ground potential through a capacitive element.

The process in fabricating the shield plate is readily compatible with conventional transistor fabrication and in one embodiment can be readily fabricated with a low cost polysilicon gate processes which requires only one additional polysilicon deposition, an additional mask, and an additional etch. The shield conductor is readily fabricated from polysilicon, polycide, silicide, and refractory metals which are stable at high temperatures.

Use of a buried shield between the gate and drain of a field effect transistor can reduce gate to drain capacitance by a factor of ten and maximizes the frequency response of any power LDMOS/VDMOS/MOSFET device. The buried shield plate is applicable to any power MOSFET and will virtually eliminate the gate to drain capacitance of vertical DMOS devices.

The invention and object and features thereof will be more readily apparent from the following detailed description and dependent claims when taken with the drawing.

BRIEF DESCRIPTION OF THE DRAWINGS

FIGS. 16A–16D are section views of lateral devices in accordance with the invention illustrate no shield plate and varying widths of shield plate.

Like elements in the several figures have the same reference numerals.

DETAILED DESCRIPTION OF THE ILLUSTRATIVE EMBODIMENTS

Figure 1:
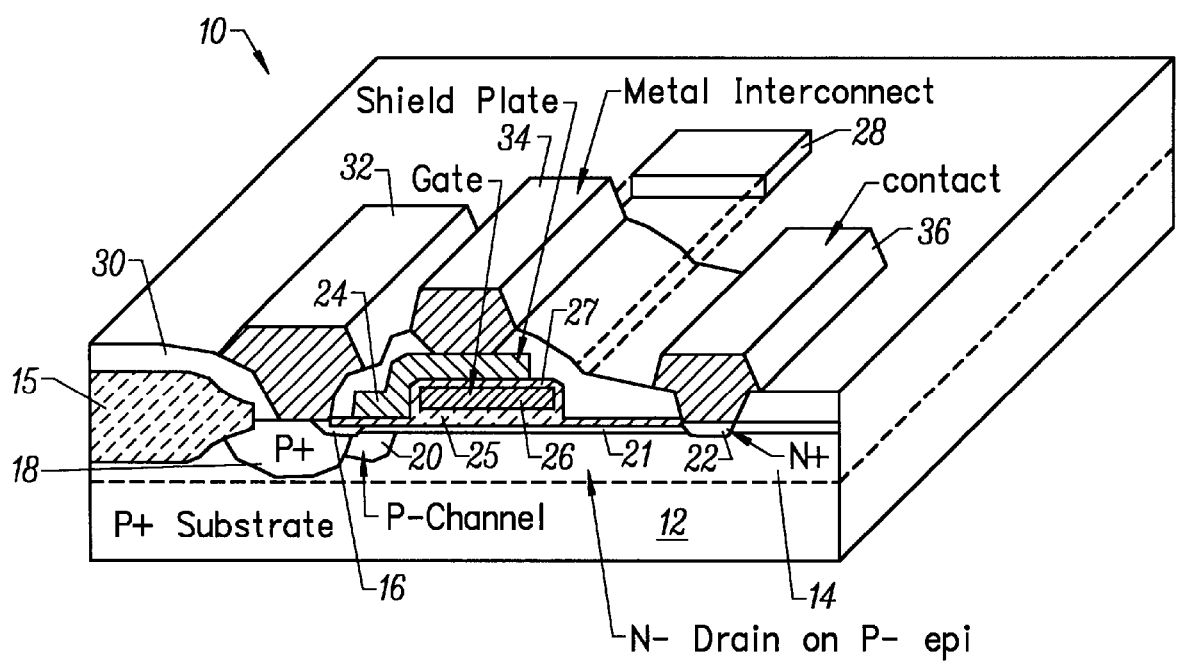
FIG. 1 is a perspective view of a shielded gate LDMOS in accordance with one embodiment of the invention.

Referring now to the drawings, FIG. 1 is a perspective view of a lateral double-diffused (DMOS) field effect transistor in accordance with one embodiment of the invention. The device shown generally at 10 comprises a P+ substrate 12 on which is formed a P– epitaxial layer 14. A field oxide 15 defines a device region in the surface of epitaxial layer 14, and an N+ source region 16 is formed in a P+ base region 18 by double-diffusion processing with base region 18 having a P doped extension 20 which defines a channel region of the transistor. N– doped region 21 and a N+ doped region 22 in epitaxial layer 14 define the drain of the transistor. A gate 24 is formed over channel 20 with a gate oxide 25 electrically separating gate 24 from channel 20 and the epitaxial layer 14.

In accordance with the invention, a conductive shield plate 26 is provided between gate 24 and the N– layer 21 of the drain with a dielectric 27 electrically isolating the shield. Shield plate 26 extends beyond the device region and has an electrode 28 for connecting AC ground and a DC potential to the shield plate. Dielectric material 30 (e.g., silicon-nitride) is provided on the surface of the device with openings therethrough for forming a source contact 32, gate contact 34, and drain contact 36. A bottom contact to the substrate is not shown.

By providing the shield between the gate and the underlying drain, capacitance therebetween can be minimized by more than a power of ten as compared to the prior art, while increasing the frequency response of an RF power device. In operation, the gate electrode is preferably tied to a DC potential and through a capacitor to AC ground. Thus, any electric field emanating from the gate electrode is terminated on the grounded shield plate, thereby minimizing $C_{gd}$. Some increase in input capacitance ($C_{in}$ or $C_{iss}$) can be compensated by input impedance matching and a minimal increase in output capacitance ($C_{out}$ or $C_{oss}$).

Figure 2A:
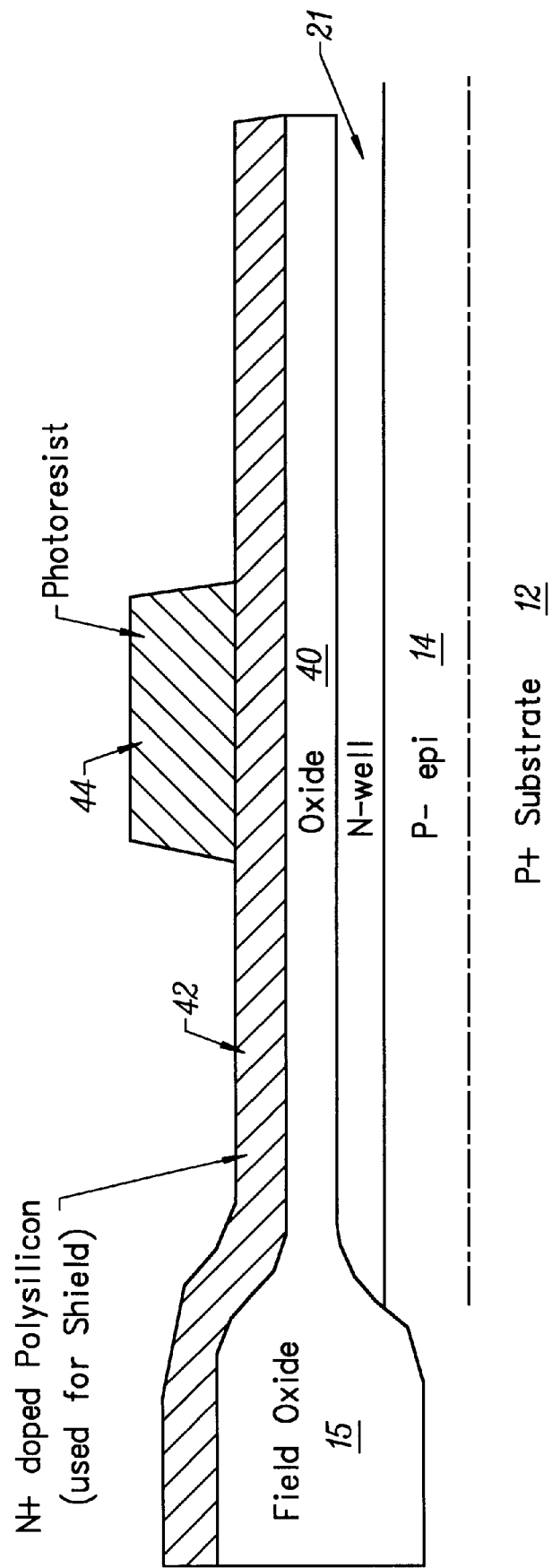
FIGS. 2A–2E are section views illustrating steps in fabricating the device of FIG. 1.

Fabrication of the device of FIG. 1 requires no complex or costly processing. For a polysilicon gate device, only one additional polysilicon deposition, one additional mask, and one additional etch are required. FIGS. 2A–2E are section views illustrating steps in fabricating the device of FIG. 1 using a conventional polysilicon fabrication process. In FIG. 2A, the field oxide 15 and oxide layer 40 are formed on the surface of N− drain region 21 in P− epitaxial layer 14 formed on P+ substrate 12. A layer 42 of N+ doped polysilicon (for forming the shield) is deposited on oxide 40 and photoresist mask 44 is provided over the desired shield.

Figure 2B:
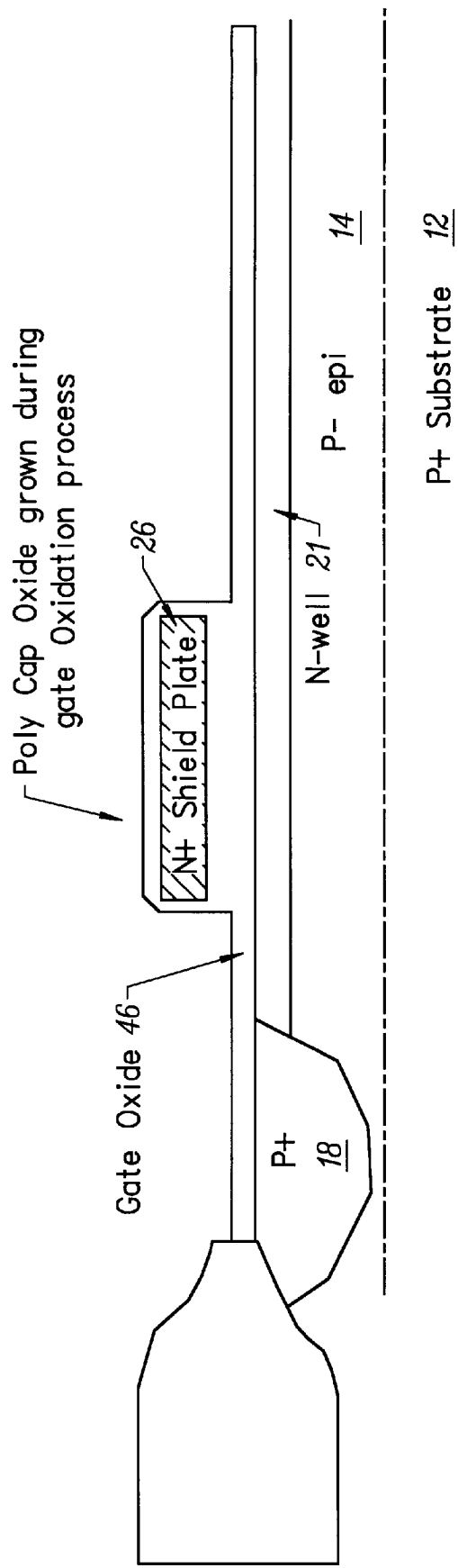

In FIG. 2B, the unmasked N+ doped polysilicon layer 44 is removed by etching leaving the N+ shield plate 26. Oxide layer 40 is also removed by etching and a gate oxide 46 is grown on the surface of epitaxial layer 14 and on the surfaces of N+ polysilicon shield plate 26. Surface areas are masked and deep P+ (boron) implants 18 is made. The gate oxidation process then forms the gate oxide of 100 to 1000 Å thickness on the section surface, depending on application requirements. The oxide formed on the top and side of the shield plate may be thicker than the oxide over the active regions since N+ polysilicon oxidizes faster than low doped or P− type silicon. For a 700 Å gate oxidation process, the oxide on top of the shield plate is approximately 1150 Å.

Figure 2C:
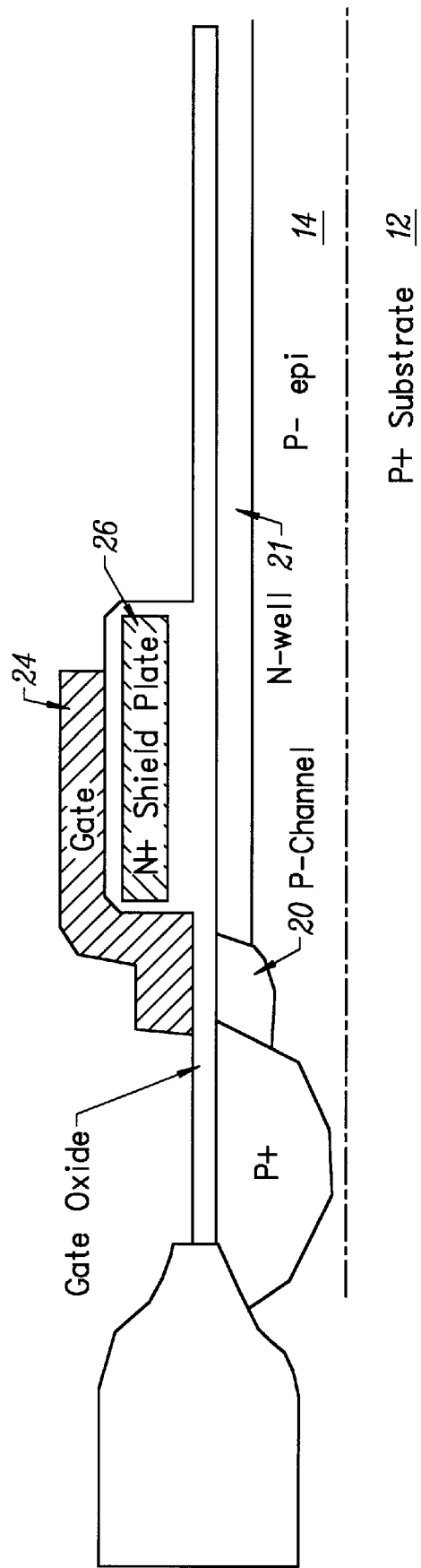

Thereafter, as shown in FIG. 2C, polysilicon gate deposition and patterning forms gate electrode 24 which can be N+ polysilicon, N+ polycide, or other suitable material. The lateral P channel 20 is formed by dopant implant and drive-in.

Figure 2D:
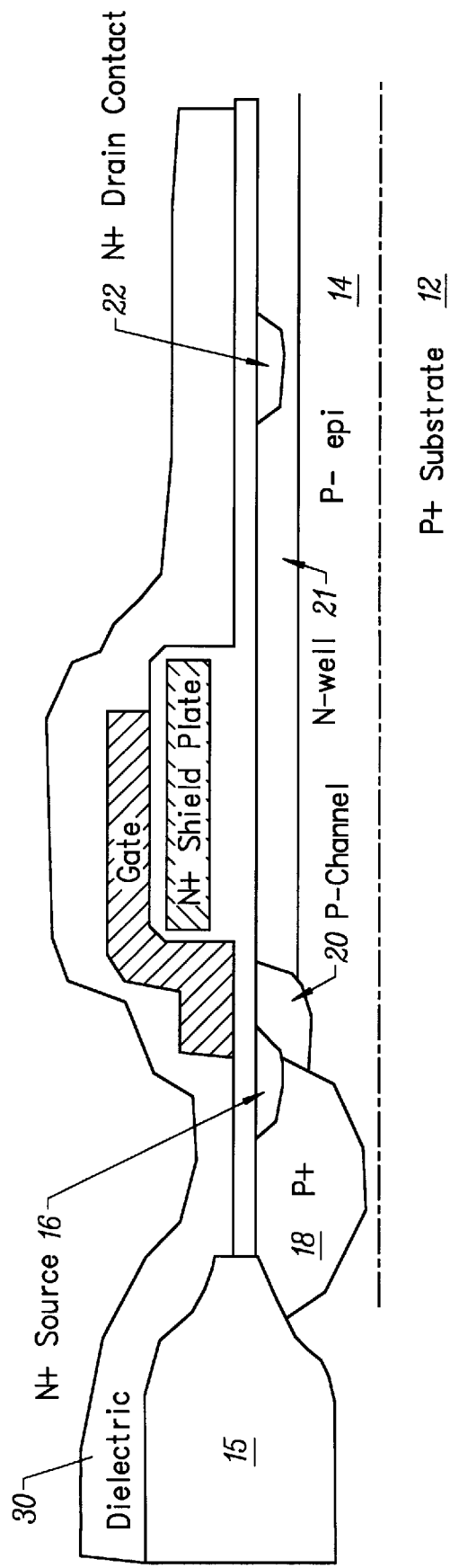
Figure 2E:
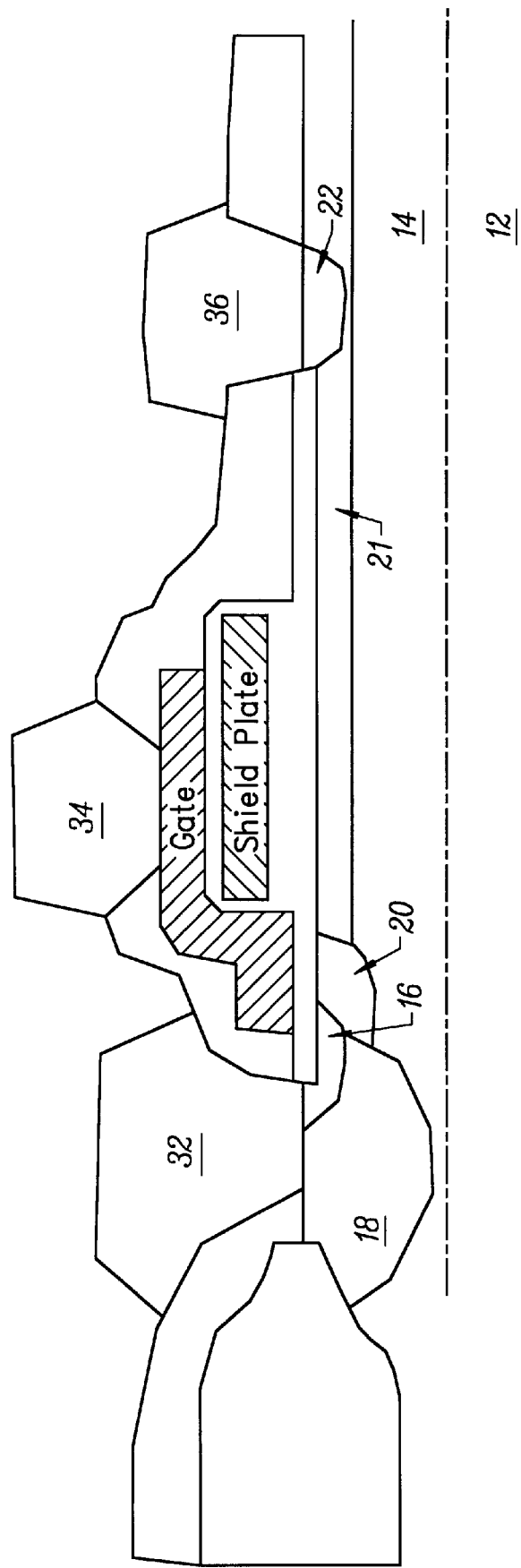

In FIG. 2D the N+ source 16 and N+ drain contact 22 are formed by implant and anneal, and dielectric material 30 (oxide, oxide/nitride, oxynitride, or doped oxide) is deposited. In FIG. 2E, the device is completed by contact mask and etch and metalization to form metal contacts 32, 34, and 36. The contact 28 to the shield plate (FIG. 1) is completed at this time also.

Figure 3A:
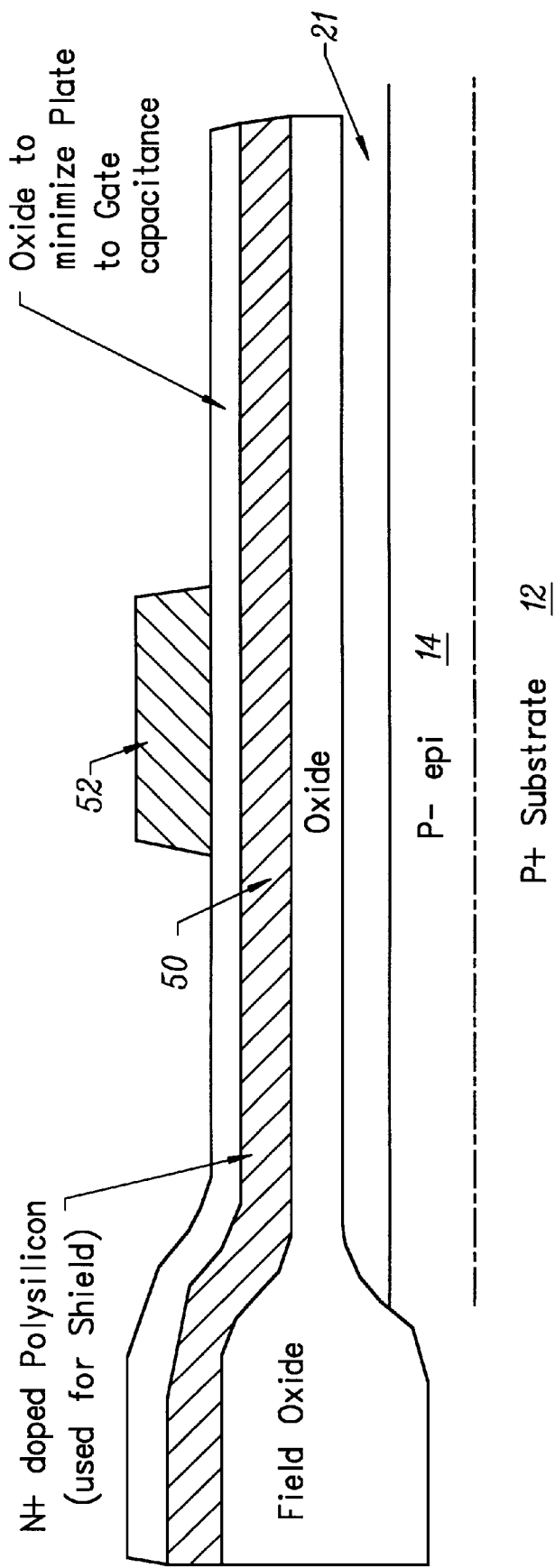
FIGS. 3A–3C are section views illustrating steps in fabricating a device in accordance with another embodiment of the invention.
Figure 3B:
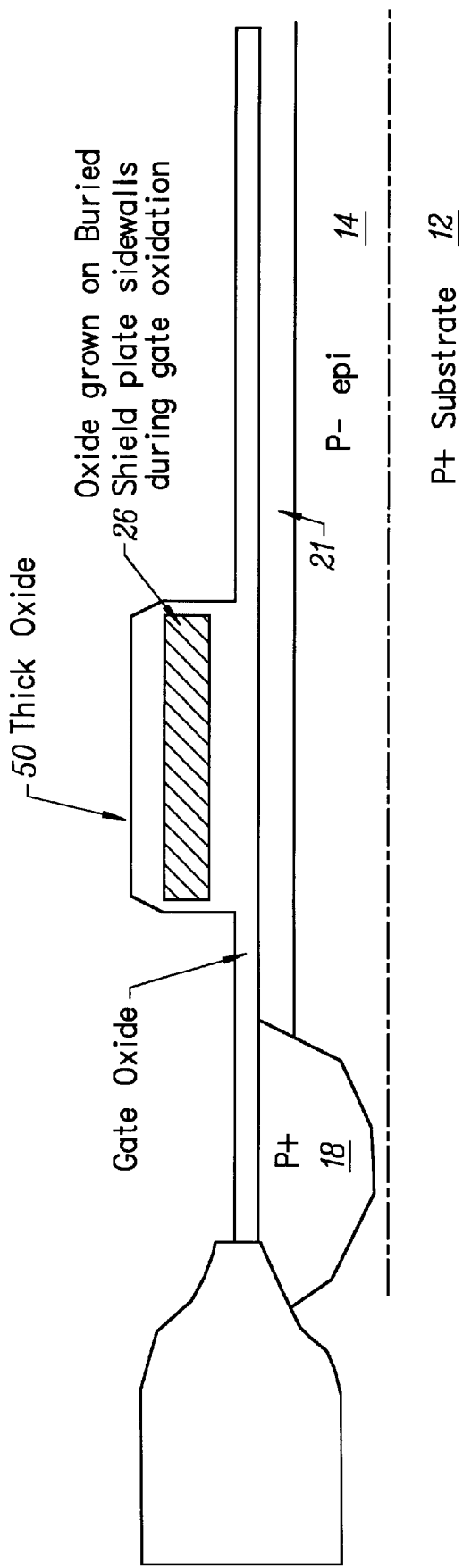

FIGS. 3A and 3B are section views illustrating one alternative embodiment in which the gate to plate capacitance is minimized by inserting an oxide on top of the buried shield plate. This ensures that the oxide on top of the polysilicon is thicker than what can be grown using only the gate oxidation, as in the first embodiment. The oxide can be grown thermally or deposited over the polysilicon shield plate. Thickness in the 500–5000 Å range is typically used. Oxide is grown on the buried shield plate sidewalls during the gate oxidation step. The oxide/shield plate/oxide stack is selectively and anisotropically etched using reactive ion etching, and the process sequence of the first embodiment is resumed. It will be noted that the oxide on the shield plate is much thicker than the gate oxide, which will reduce the shield plate to gate capacitance.

Figure 3C:
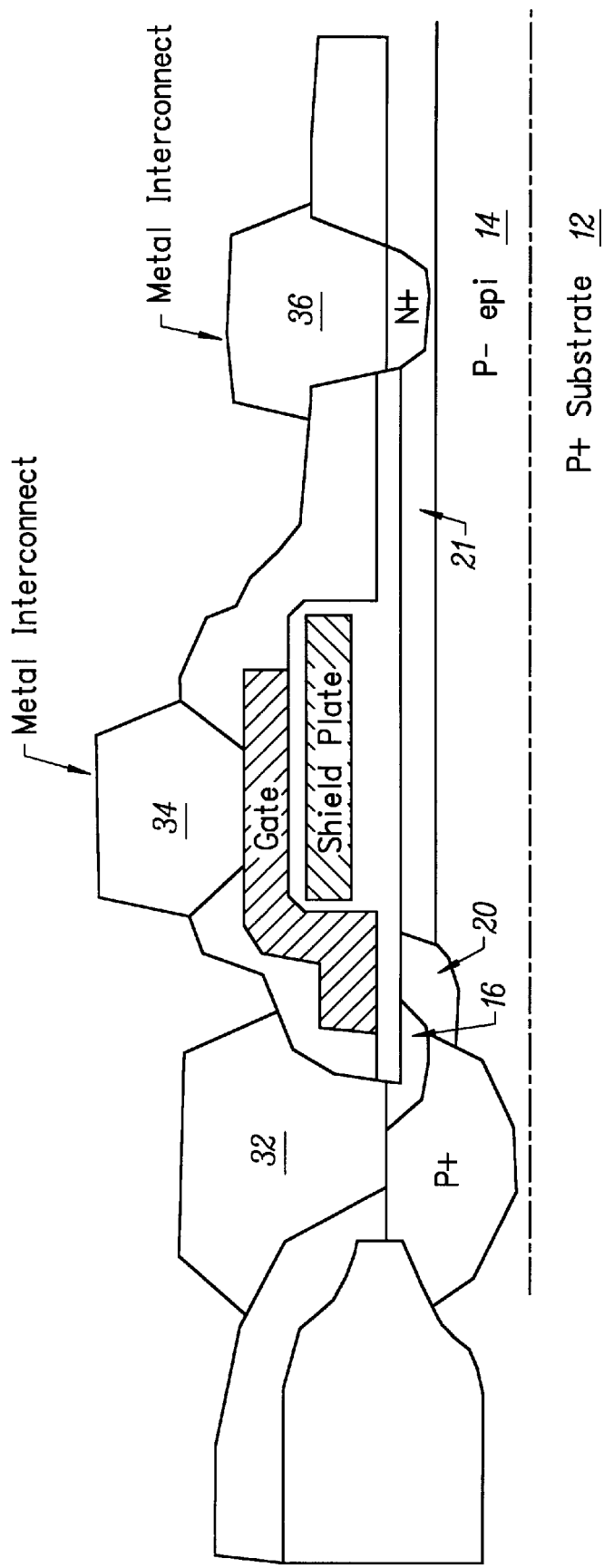

In FIG. 3C the second embodiment is completed using the process of FIG. 1.

Figure 4A:
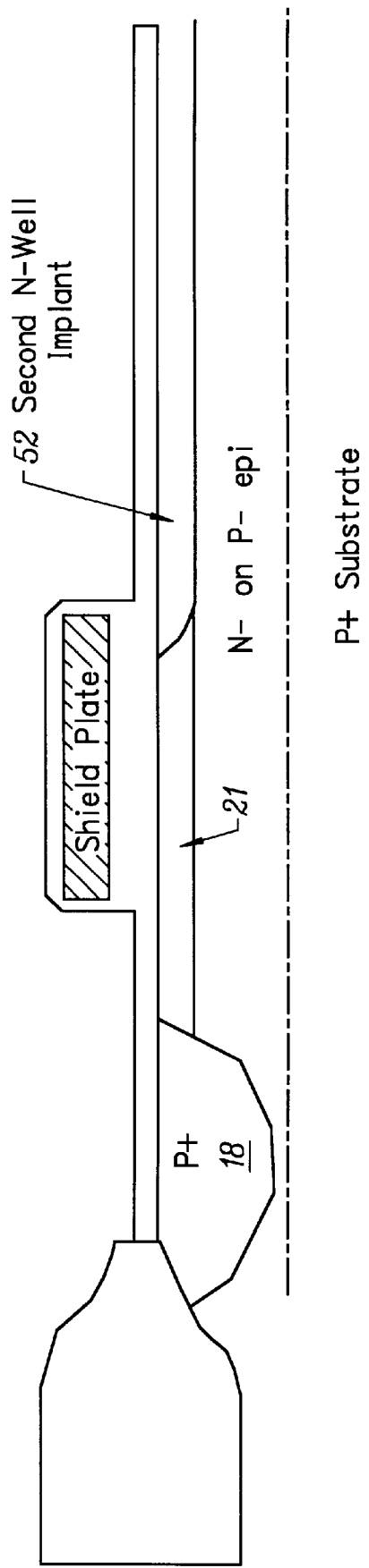
FIGS. 4A and 4B are section views illustrating steps in fabricating a device in accordance with another embodiment of the invention.
Figure 4B:
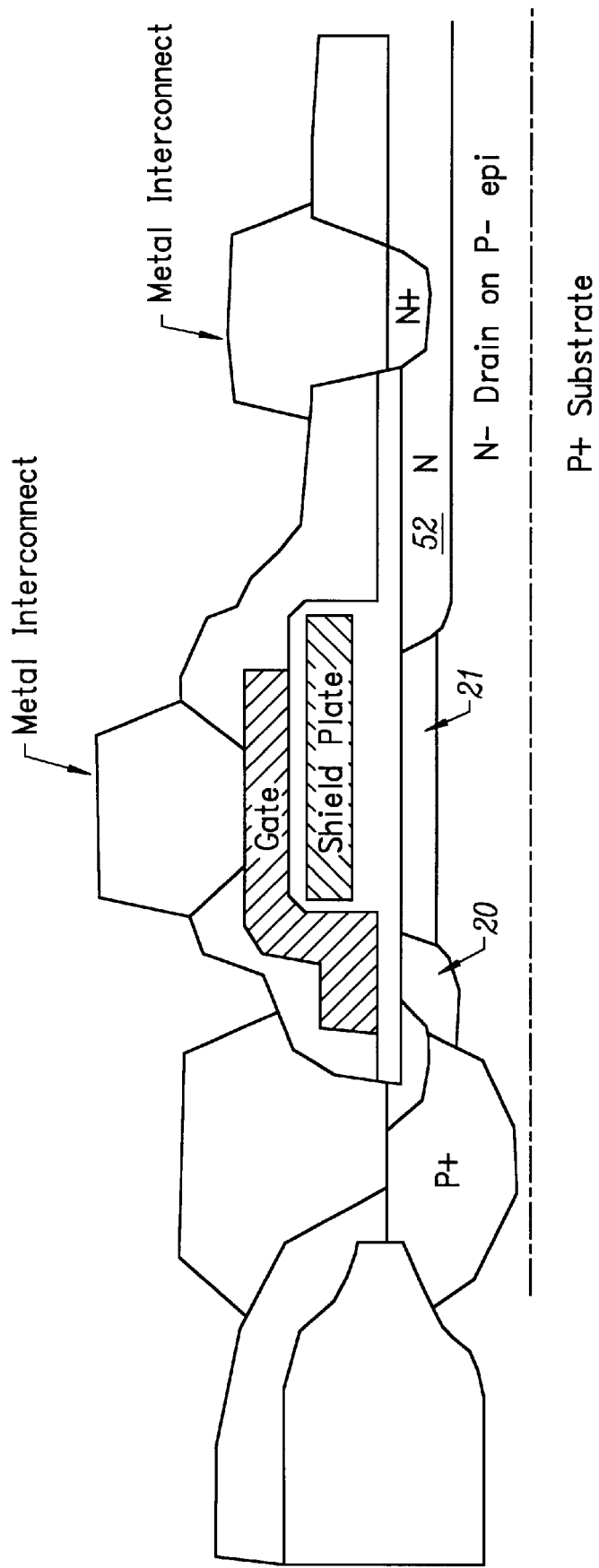

FIGS. 4A, 4B are section views illustrating another embodiment of the invention in which a second N-well implant 52 is formed in the drain region, for example, an arsenic dopant at 1E11-5E12 concentration. The finished device is illustrated in FIG. 4B. The second N-well 52 maximizes doping around the N+ drain contact thereby maximizing the device drain-to-source breakdown voltage, minimizing on resistance, while having no impact on the output capacitance.

Figure 5:
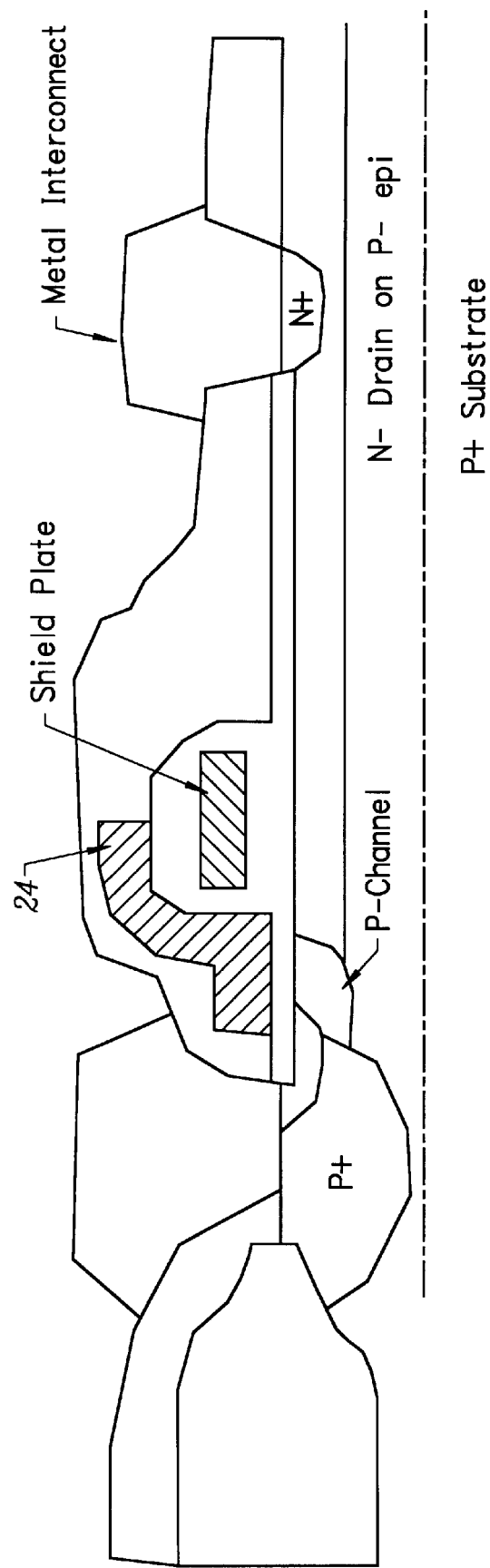
FIGS. 5–7 respectively show sideviews of other embodiments of lateral transistor structures in accordance with the invention.

FIGS. 5–7 are section views of other embodiments of lateral DMOS transistors. In FIG. 5, a polycide gate 24 is used which requires no direct metal interconnect due to the low resistance of polycide material. Less gate overlap over the field plate results in lower $C_{rss}$ and $C_{iss}$. The shield plate is typically 0.5 to 1.5 μm wide with gate overlap of 0.5 to 1.0 μm. The channel to drain (drift region) width can be minimized to reduce the on resistance. An advantage of using polycide for the shield and/or gate is the step coverage (topography of the finished device) can be improved since the gate and shield thickness can be minimized, due to the low resistance of silicide.

Figure 6A:
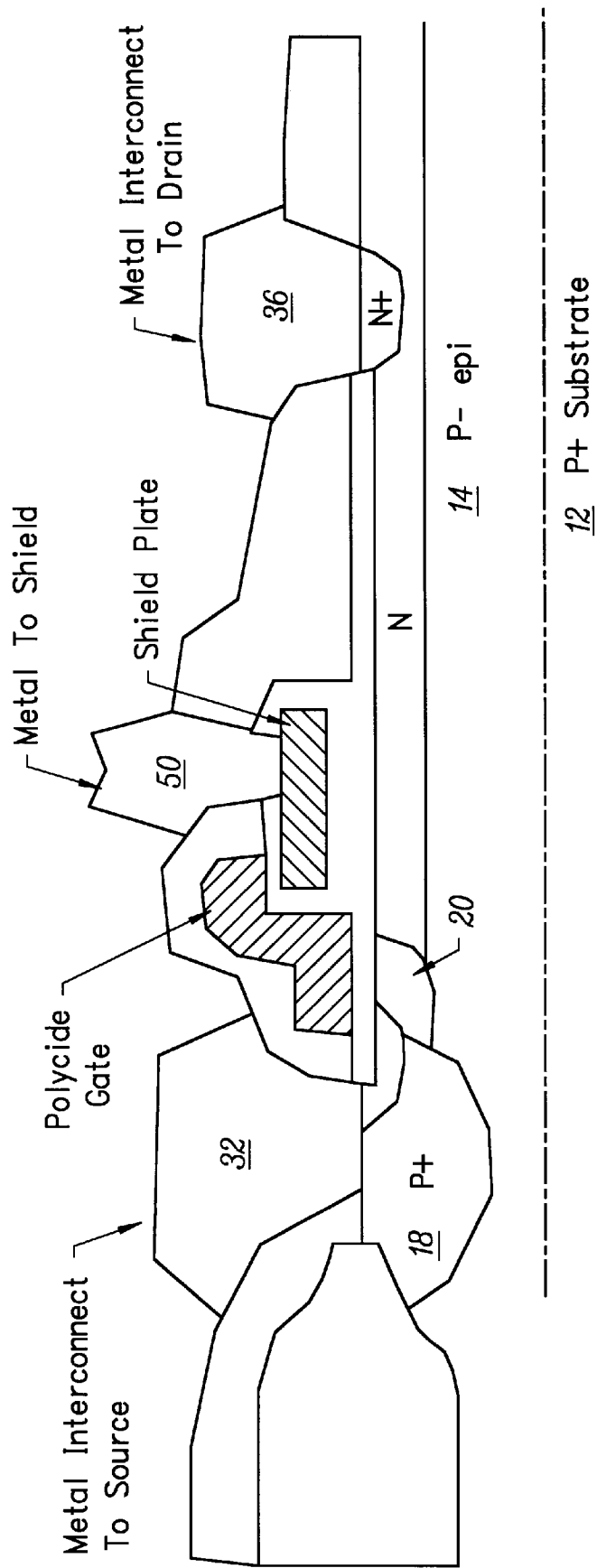

FIG. 6A is an embodiment of the invention in which a metal to shield contact 50 is provided directly above the shield plate 26 with contact 50 reducing lateral capacitive components from the gate to drain and minimize series resistance. No extra mask steps or processing is required. A typical gap of 0.5 μm is provided between the shield contact 50 and the drain/gate regions.

Figure 6B:
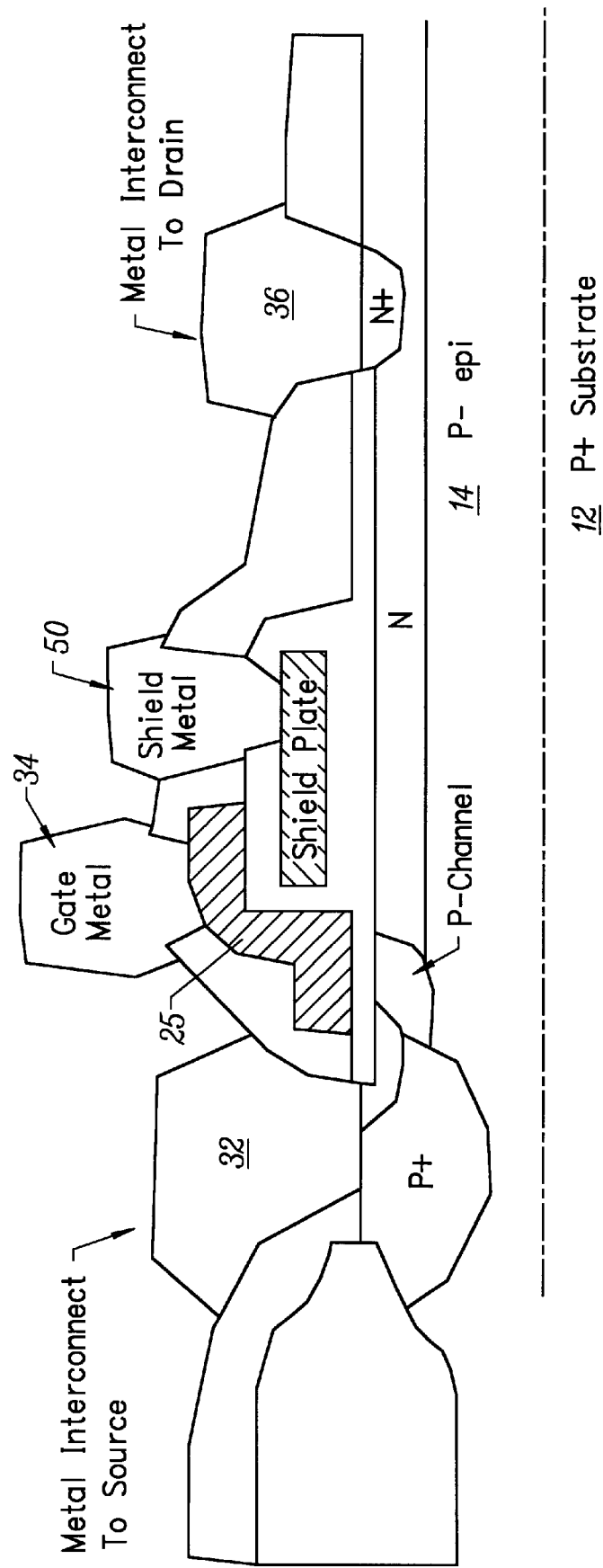

In FIG. 6B, a direct metal contact 34 is made directly to gate 25. By providing direct metal contacts to the gate and shield, series resistance is minimized. Again, this embodiment requires no additional masking steps or processing. The polysilicon gate can be 1 to 3 μm wide with the shield 2–5 μm wide.

Figure 7A:
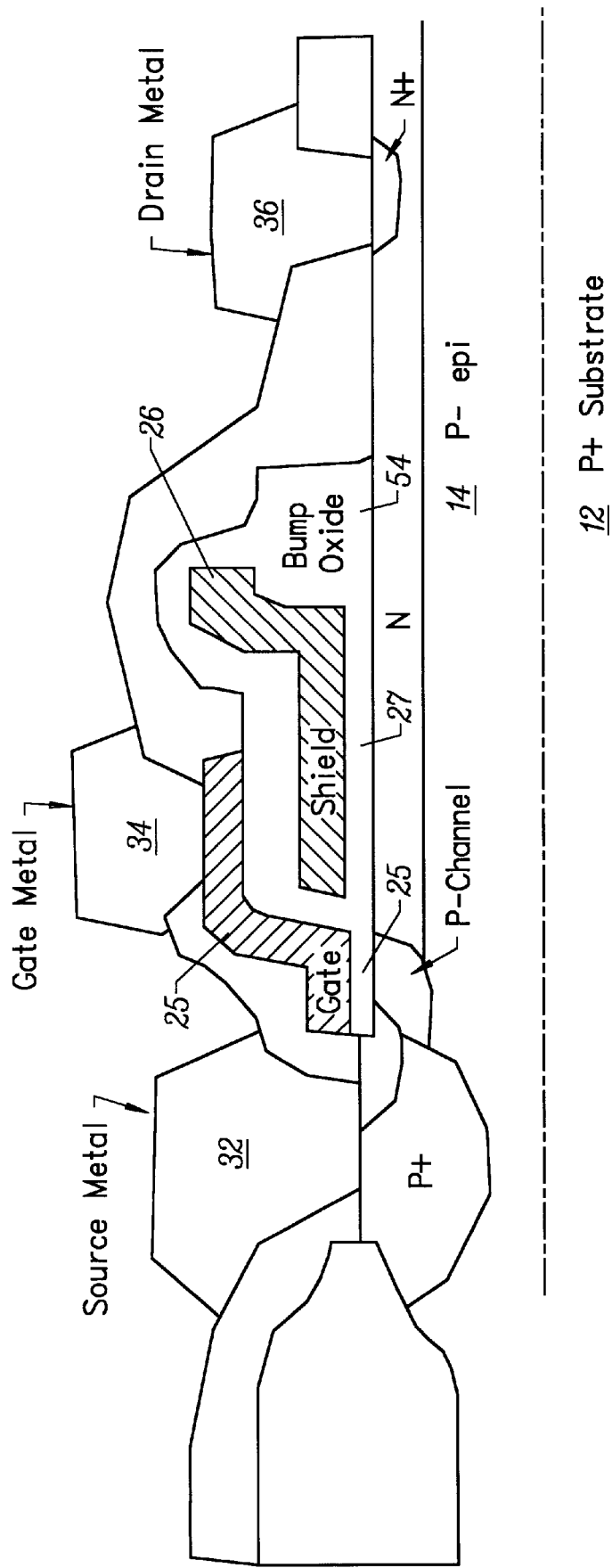
Figure 7B:
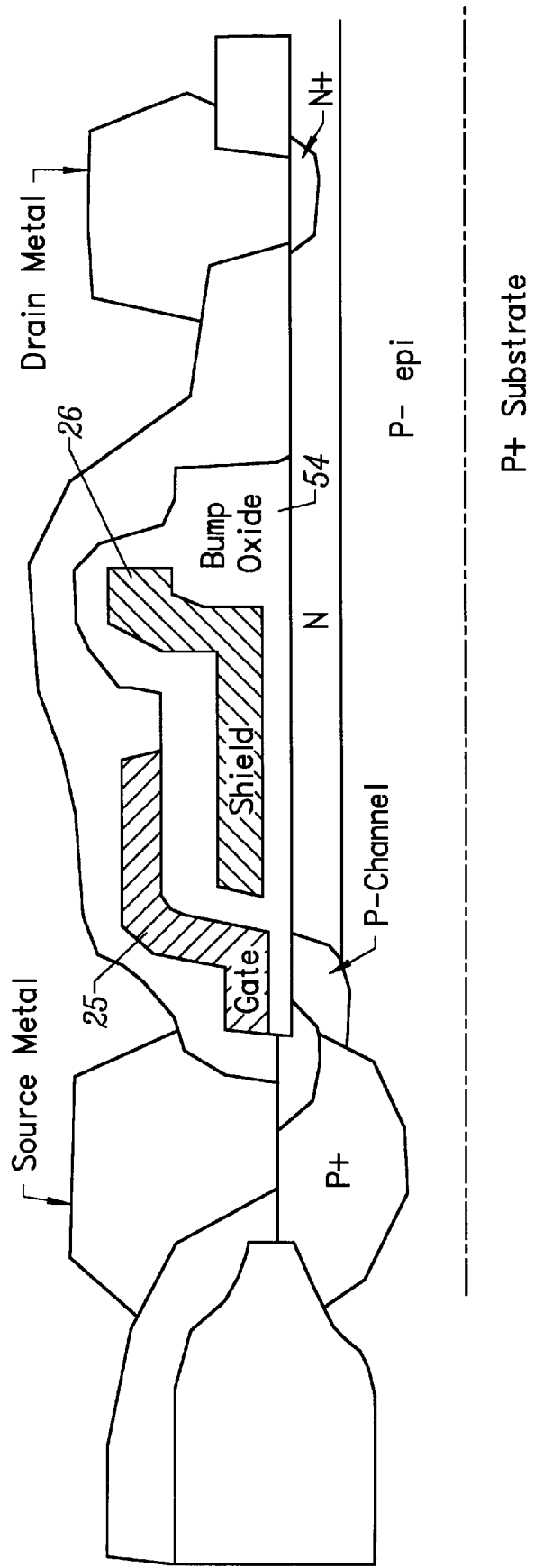

FIGS. 7A, 7B are section views of two embodiments in which two different oxide thicknesses are provided under the shield 26 including a thinner oxide 27, and a thicker bump oxide 54. The thicker portion is located between the drain in gate electrodes and forms a raised section over the drain to minimize the lateral capacitance between the drain and gate. The thinner oxide portion 27 under the shield, and the thinner oxide 25 under the gate are as described in other embodiments. The shield can be polysilicon or polycide.

In FIG. 7B, a polycide gate 25 is employed and does not require direct metal contact on the gate thereby achieving lateral shielding between the drain and gate electrodes. Again, the shield may be polysilicon or polycide. The thickness of bump oxide 54 is preferably selected to be approximately equal the thickness of the shield plus the thickness of the oxide under the shield plus the thickness of the oxide over the shield.

Figure 8A:
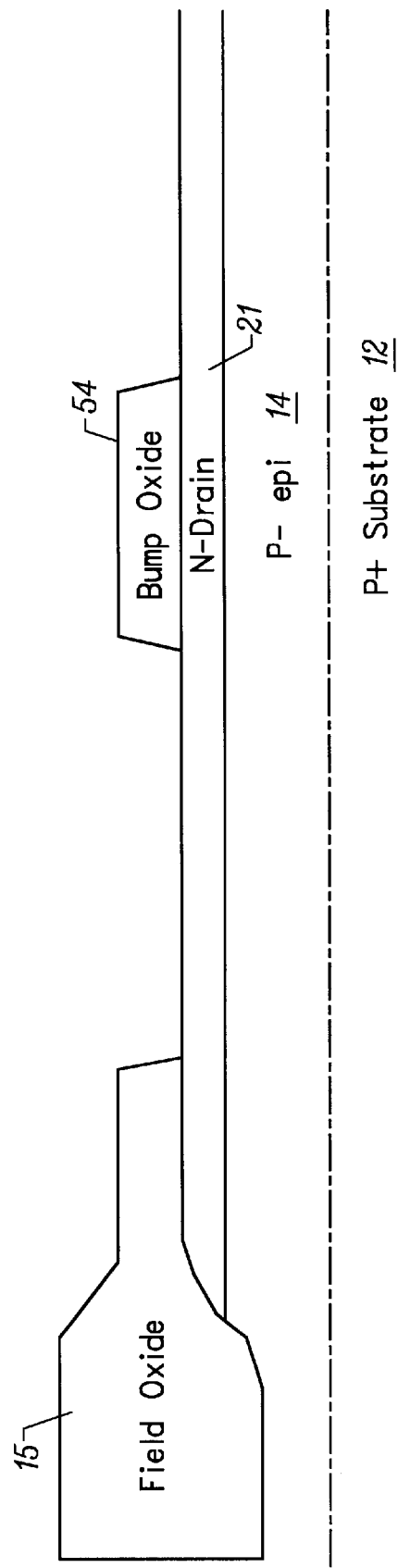
FIGS. 8A–8D illustrate process steps in fabricating the device of FIG. 7.

FIGS. 8A–8D are section views illustrating steps in fabricating the devices of FIGS. 7A, 7B. In FIG. 8A, a standard field oxidation is employed including a thin oxide, nitride, active area mask, nitride edge, and oxidation. An optional deep sinker realization for grounded source LDMOS device can be formed either before or after field oxidation (not shown). An in-drain region 21 is formed either before field oxidation or after field oxidation and before formation of the buried shield plate. The bump oxide 54 is grown over the active area to a thickness of 2,000–10,000 Å, and then the bump is masked and the oxide etched.

Figure 8B:
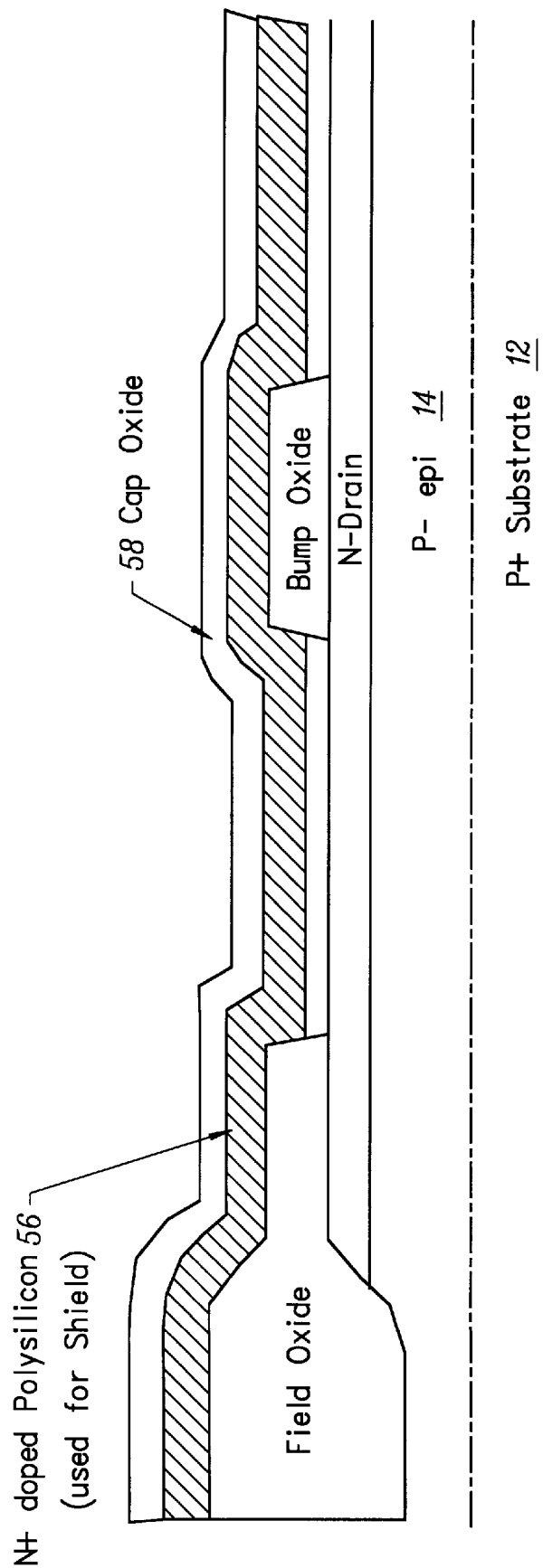

In FIG. 8B, a reoxidation of the surface is formed (1000–5000 Å) and a polysilicon deposition 56 is made to form the shield electrode. The shield electrode material may be a polycide, silicide or high-temperature refractory metal such as tungsten. For a polysilicon deposition, N-type doping or implant is used to increase the conductance of the deposit polysilicon. A cap oxide 58 is then formed to a thickness of 500 Å to 5000 Å.

Figure 8C:
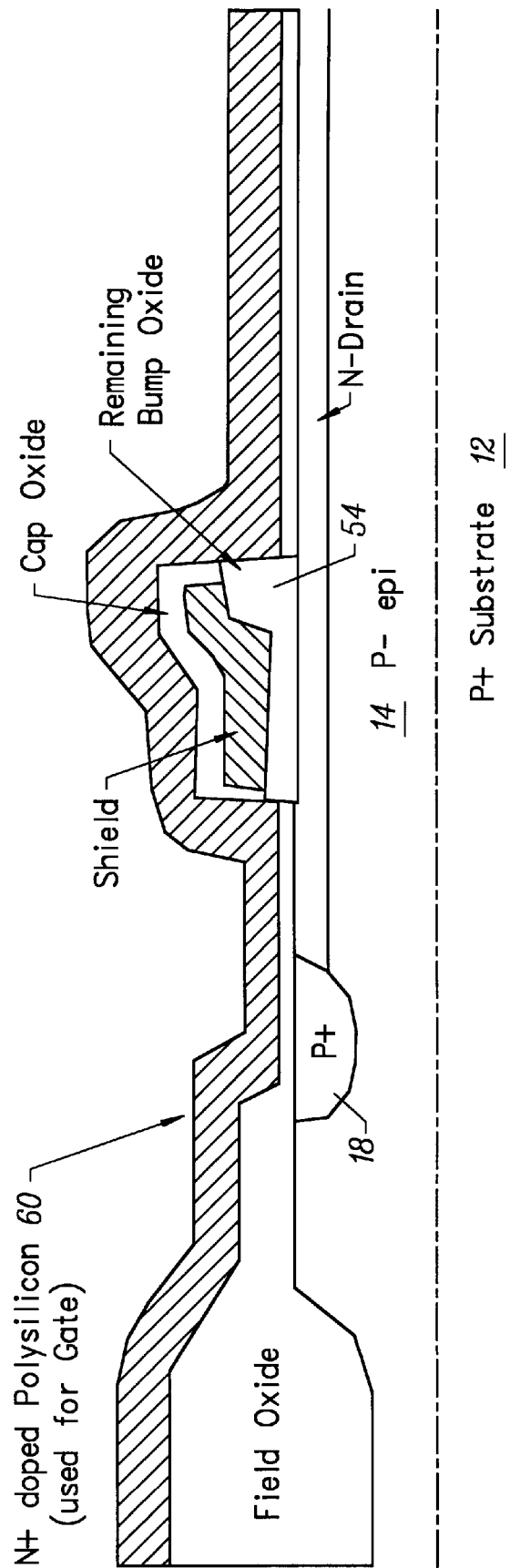

In FIG. 8C, the shield is masked followed by cap oxide, shield, and oxide etch, with the shield overlapping the bump oxide 54 being on the order of 0.5 μm. P+ source region 18 is formed and then a polysilicon or polycide deposition 60 is formed, followed by N+ doping of the deposited material.

Figure 8D:
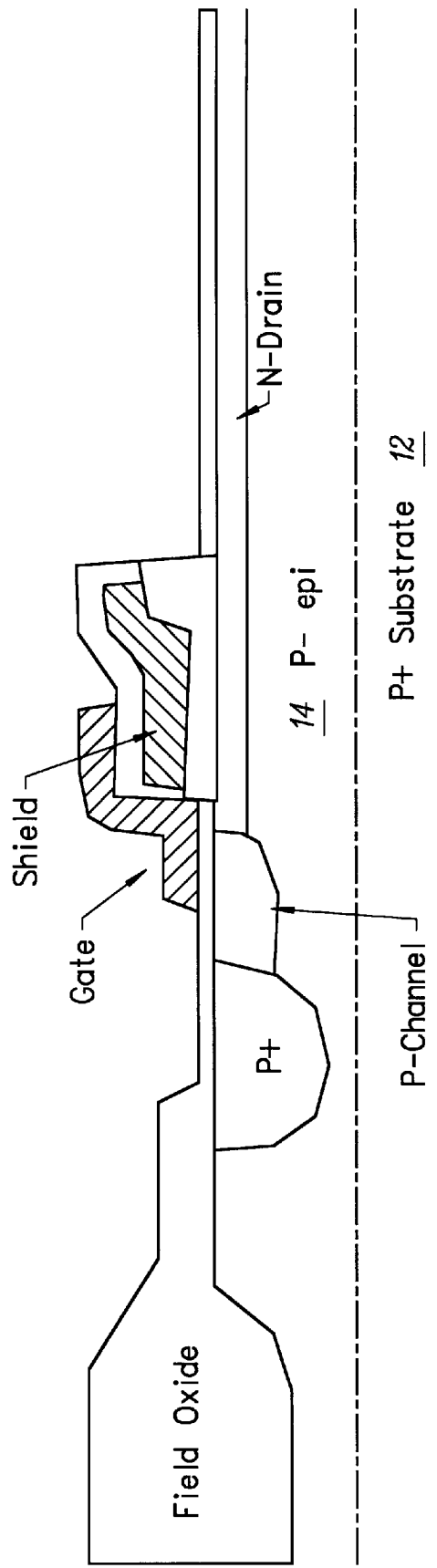

In FIG. 8D, the device is completed by gate mask and etch, channel mask and channel implant (boron), and channel dopant drive-in. The device is completed by N+ mask and implant, final drive, dielectric deposition, contact mask and etch, and metalization.

Figure 9:
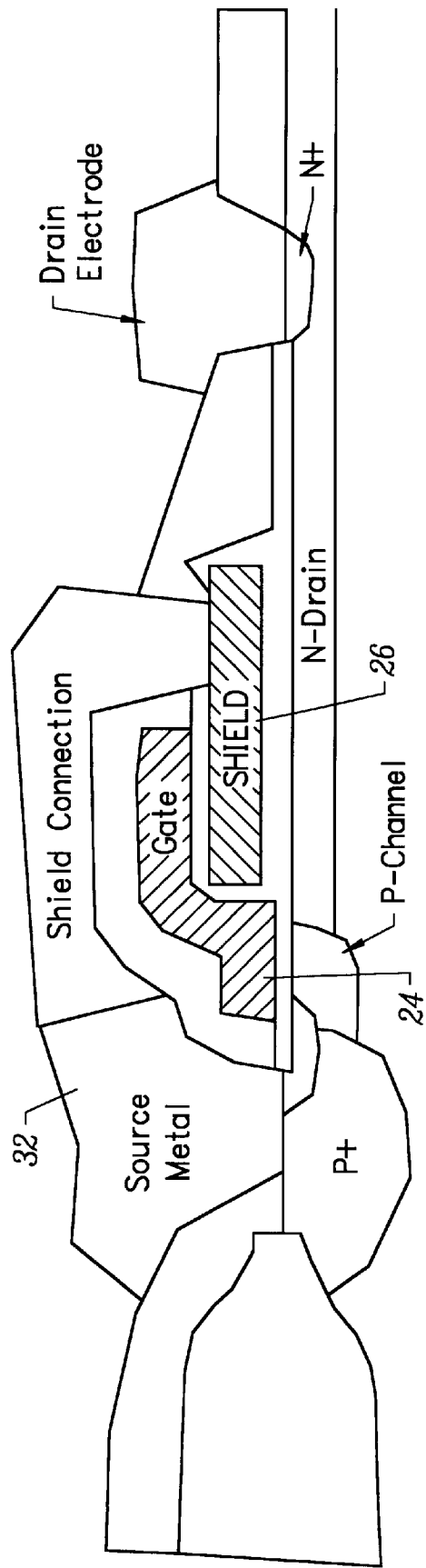
FIGS. 9–14 are section views of other embodiments of the invention.

FIG. 9 is a section view of an embodiment in which the source metal 32 is extended over the gate 24 and contacts shield 26. The shield connection metal does not directly overlap the drain region because of the gate and shield therebetween. By extending the source metal three-dimensional shielding on all sides is provided for the gate. A polycide is preferably used for the gate 24.

Figure 10:
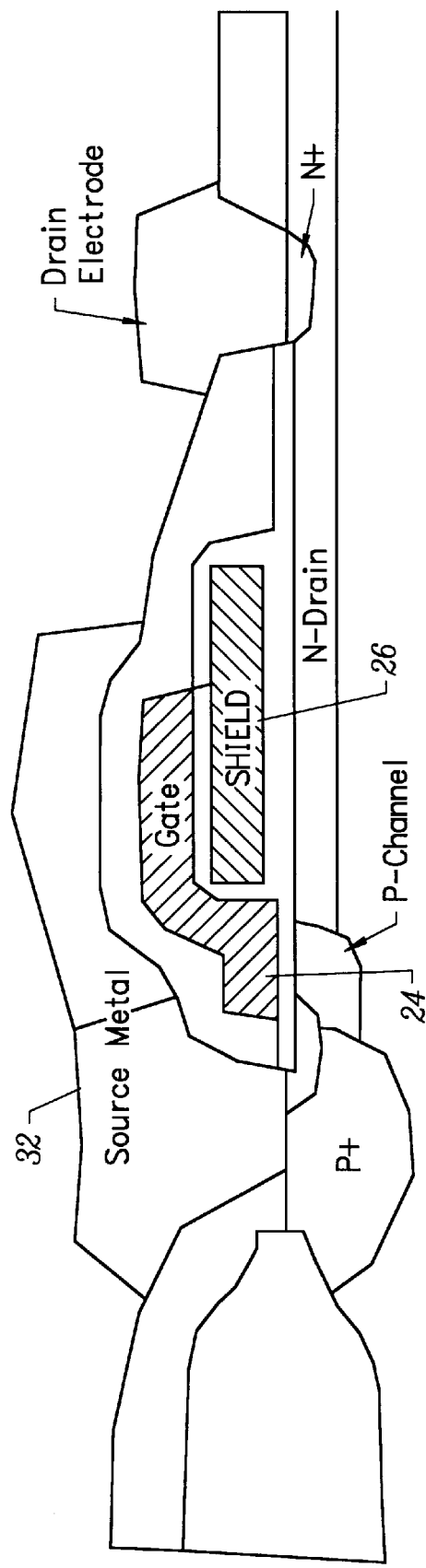

In FIG. 10, the source metal extends over gate 24 to provide a Faraday shield over the gate, but source metal 32 does not contact shield 26. Again, polycide gate is preferred.

Figure 11:
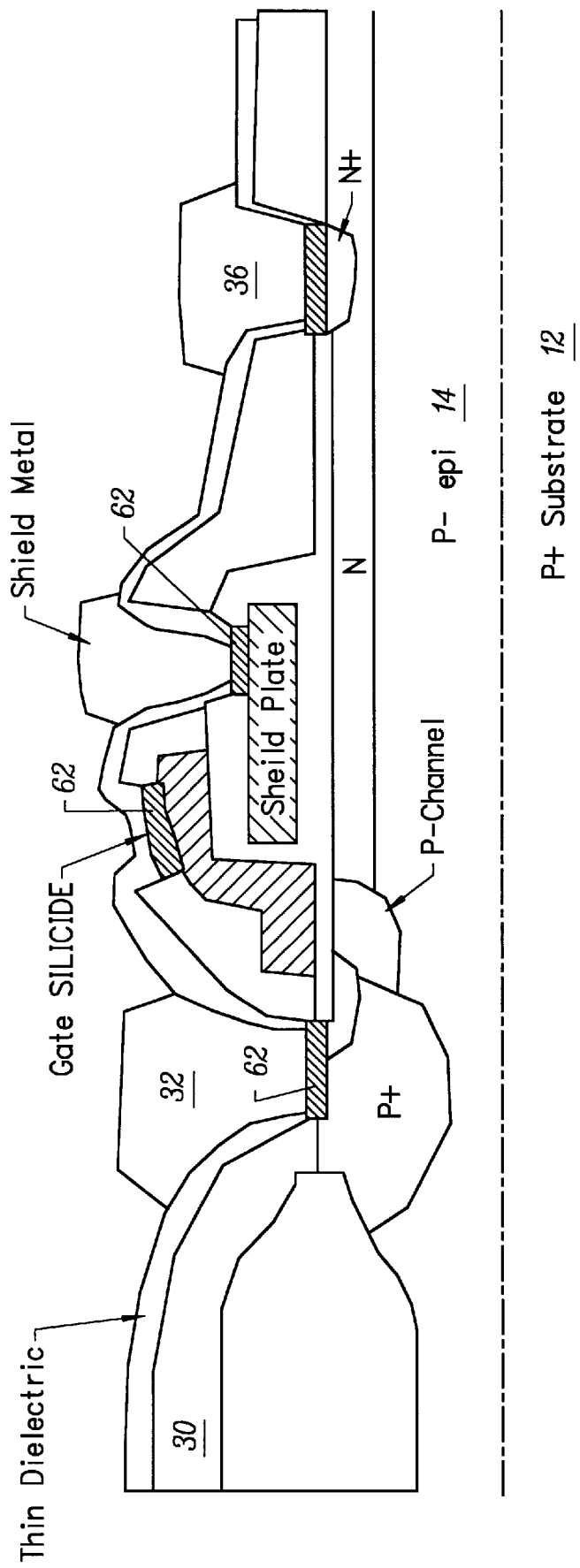

FIGS. 11–14 are embodiments of the device in which a self-aligned silicide (or salicide) is used to reduce the resistance of the gate and shield electrodes. The silicides are formed selectively in the silicon and polysilicon exposed contacts after the contact pass through the passivation layers. Use of silicide avoids the need for a polycide gate structure. FIG. 11 is similar to the embodiment of FIG. 5B up to and including the contact etch for the first dielectric 30. Thereafter, a self-aligned silicide 62 is formed on the contacts by sputter depositing titanium, platinum or cobalt and then reacting the deposited metal to form silicide (400–900° C.), then etching the unreacted metal from the dielectric surfaces. An optional deposit of a thin (500–3000 Å) dielectric (oxide, nitride, or oxynitride) at low temperatures can be used to passivate the gate silicide and minimize gate to source or shield to gate metal shorts. An optional contact mask can be used to expose contacts where metal electrodes will be formed and metalize the wafer.

Figure 12:
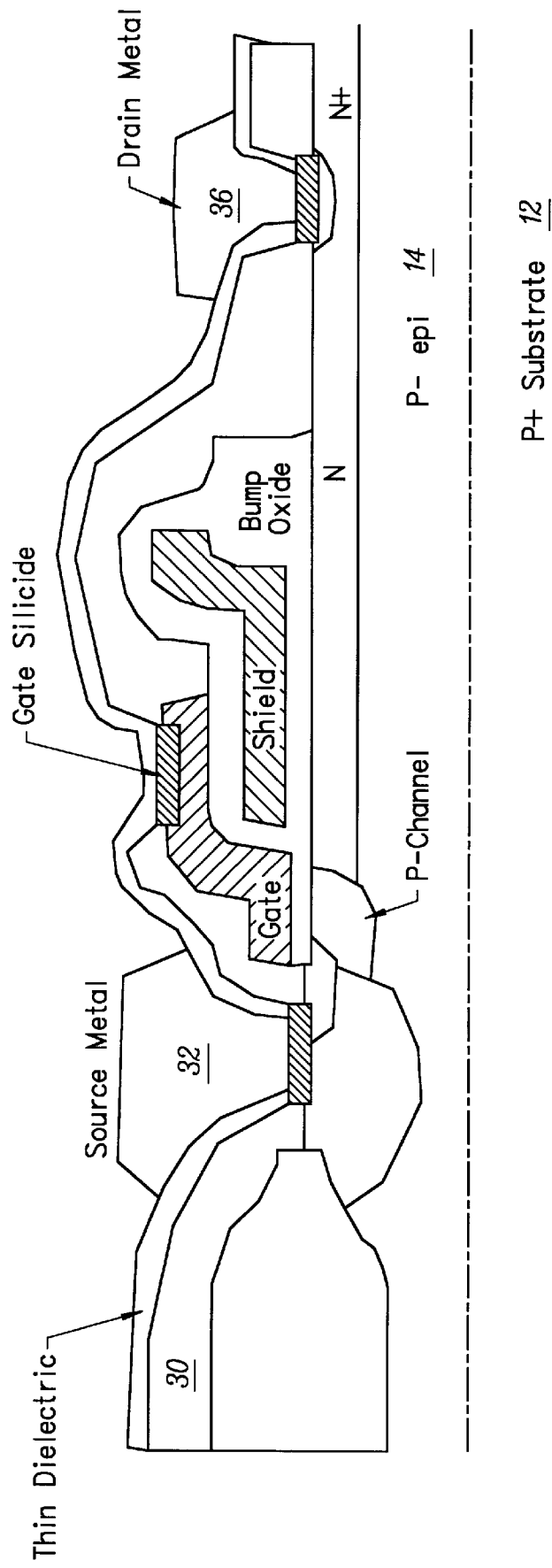

The embodiment of FIG. 12 is similar to the embodiment of FIG. 7 with exception that the metal electrode over the gate is replaced by a self-aligned silicide process on the gate. Two different oxide thicknesses under the shield are present. Note there is no need for direct metal over the gate contact region.

To minimize lateral capacitance coupling between the gate and drain interconnects, the drain contact can be silicided and thus avoid the need for direct metal contact. The drain contact can be titanium, platinum, and cobalt silicides, for example, formed on the N+ drain contact diffusion. A tungsten silicide can be deposited on top of a doped silicon or on top of the N+ drain contact diffusion. The drain series resistance will increase, but this does not significantly effect power gain. Source resistance is more critical in power gain.

Figure 13:
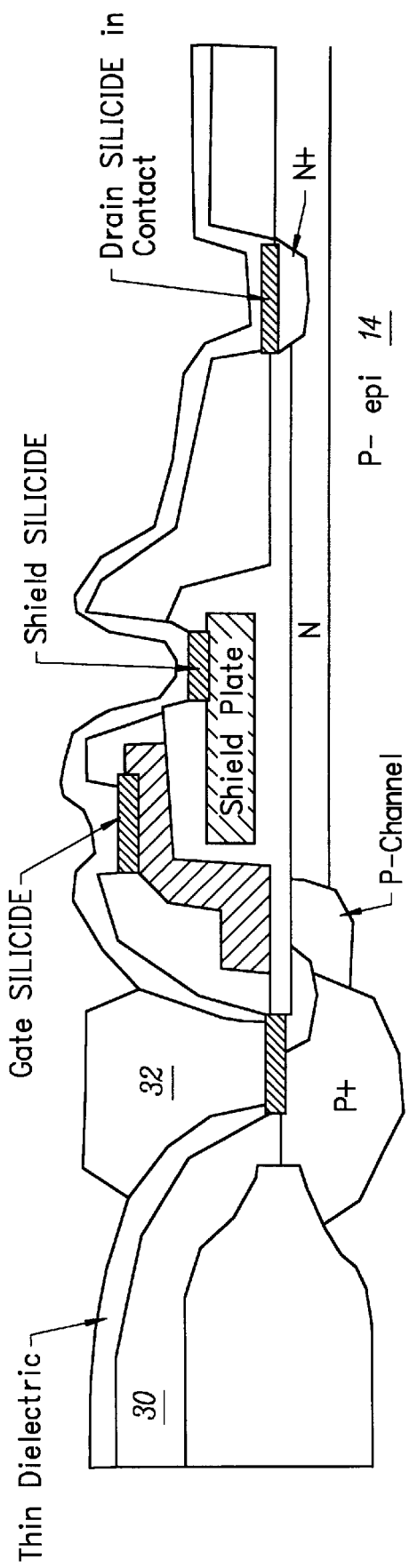

The embodiment of FIG. 13 is similar to the embodiments of FIGS. 2, 3, and 11, but with self-aligned silicide contacts being used. After a contact mask through the dielectric is formed, a self-aligned silicide in the contacts are deposited by sputtering the metal and reacting the metal to form silicide at 400–900° C. Unreacted metal is then etched from the dielectric surfaces. Optionally, a thin dielectric (500–3000 Å) of oxide, nitride, or oxynitride is made at low temperatures. This is used to passivate the gate silicide and minimize gate to source or shield to gate metal shorts. An optional contact to mask can be used to expose contacts where metal electrodes will be formed and metalize the wafer and metalize the source region 32, and ends of gate, shield and drain. The gate can be a polycide or polysilicon with silicided contacts.

Figure 14:
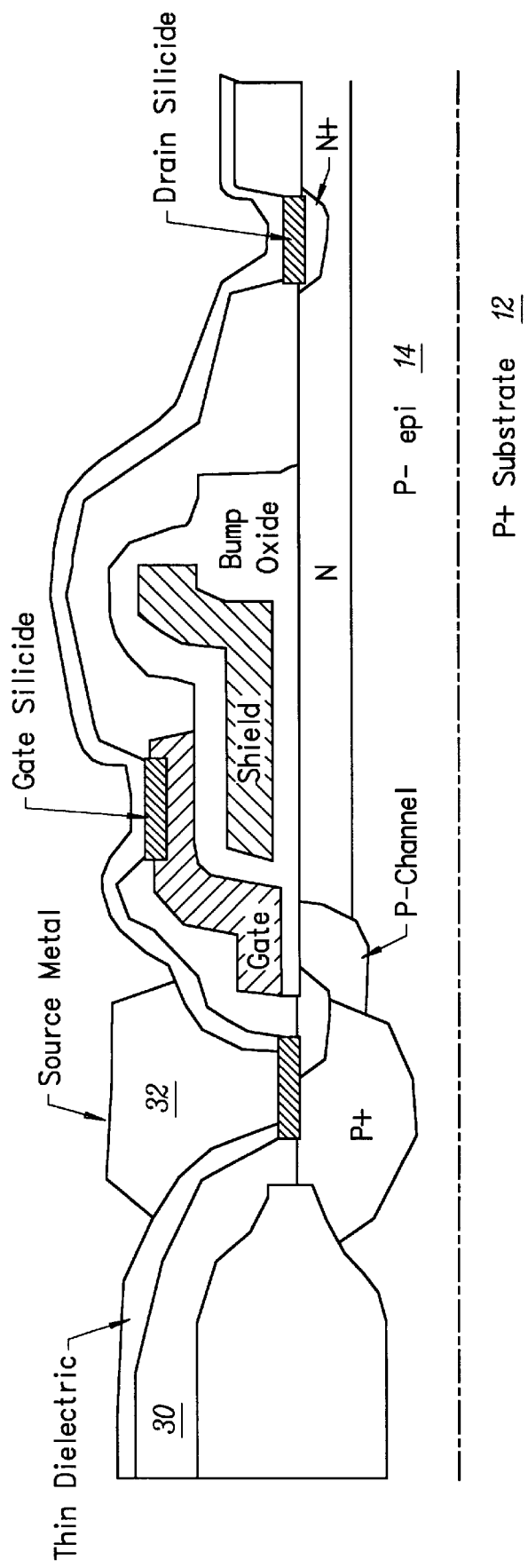

FIG. 14 is an embodiment similar to the embodiment of FIG. 12 using a bump oxide with the exception that the metal electrode over the drain is eliminated. The bump oxide shield provides lateral isolation between the gate and drain.

Figure 15:
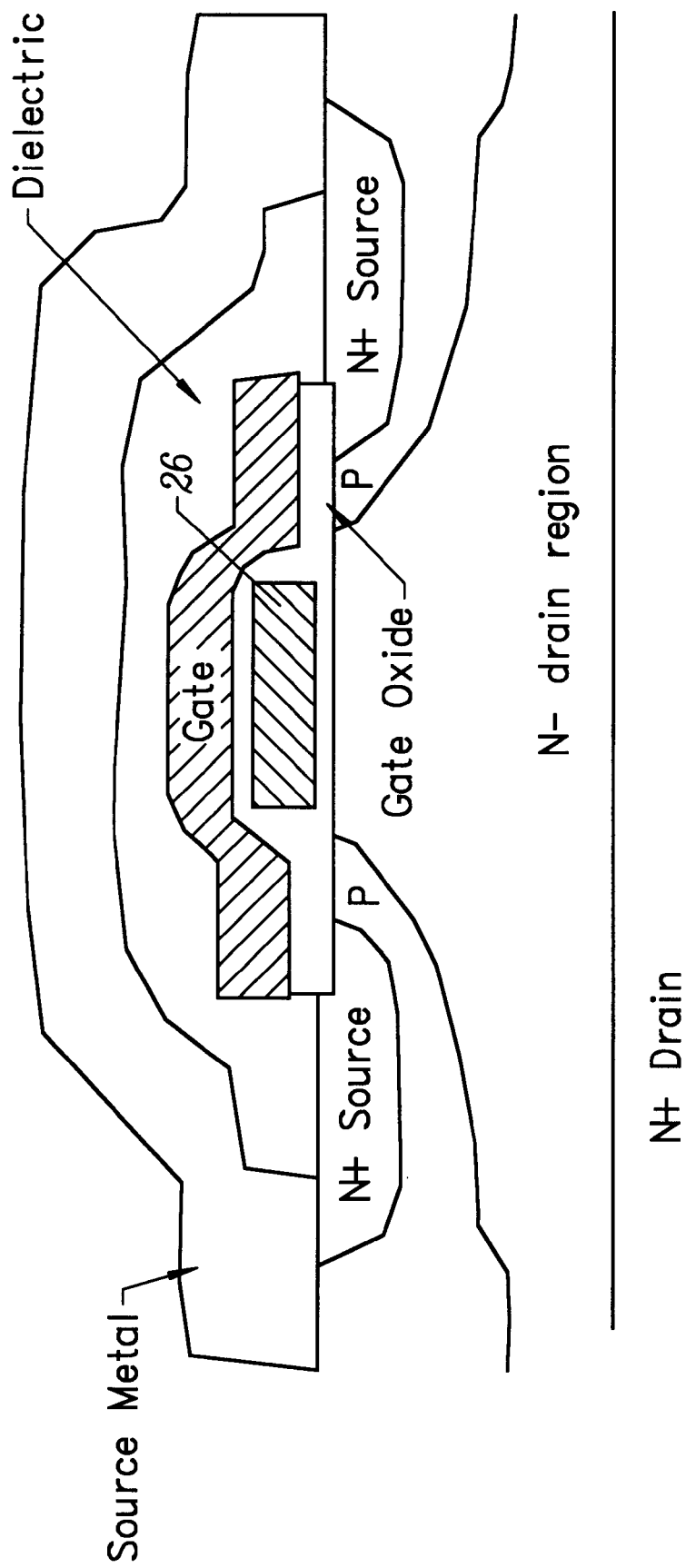
FIG. 15 is a section view illustrating a vertical DMOS device in accordance with an embodiment of the invention.

FIG. 15 is a section view of a vertical DMOS device in which the shield plate 26 is positioned directly above the vertical drain region under gate 24. A similar process to the LDMOS of FIG. 2 is employed in forming the buried shield plate for the vertical device. The polysilicon shield plate is deposited and patterned before definition of the gate electrode. The shield plate is connected to a low fixed potential (e.g., source). Gate to drain capacitance is effectively shielded due to a very limited region where the gate directly overlaps the drain.

A key parameter in the resulting devices is the width of the shield plate. By minimizing the overlap of the shield plate over the drain, negative impact on the output capacitance and on the breakdown voltage of drain to substrate are minimized. However, the shield plate width should be sufficient to ensure that the gate does not overlap the drain directly, otherwise, gate to drain capacitance will not be minimized. The N-well doping level for the drift region of the drain can be adjusted to tailor the breakdown voltage of the drain to substrate.

FIGS. 16A–16D are section views of four lateral devices having varying widths of shield plate. FIG. 16A has no shield plate, FIG. 16B has a field plate shorter than the gate, FIG. 16C has field plate aligned with the gate, and in FIG. 16D the field plate is wider than the gate by 0.5 $\mu$m. The following table provides shield plate simulation results for the various widths of field plate in FIGS. 16A–16D:

| Width  | 0     | 2      | 2.5   | 3      |
|--------|-------|--------|-------|--------|
| Ciss12 | 50.99 | 108.66 | 96.22 | 102.60 |
| Ciss25 | 48.55 | 99.04  | 96.09 | 102.52 |
| Coss12 | 19.12 | 33.58  | 17.02 | 16.15  |
| Coss25 | 10.58 | 12.71  | 10.56 | 11.30  |
| Crss12 | 6.35  | 17.22  | 0.89  | 0.30   |
| Crss25 | 2.40  | 3.73   | 0.46  | 0.21   |

Figure 17:
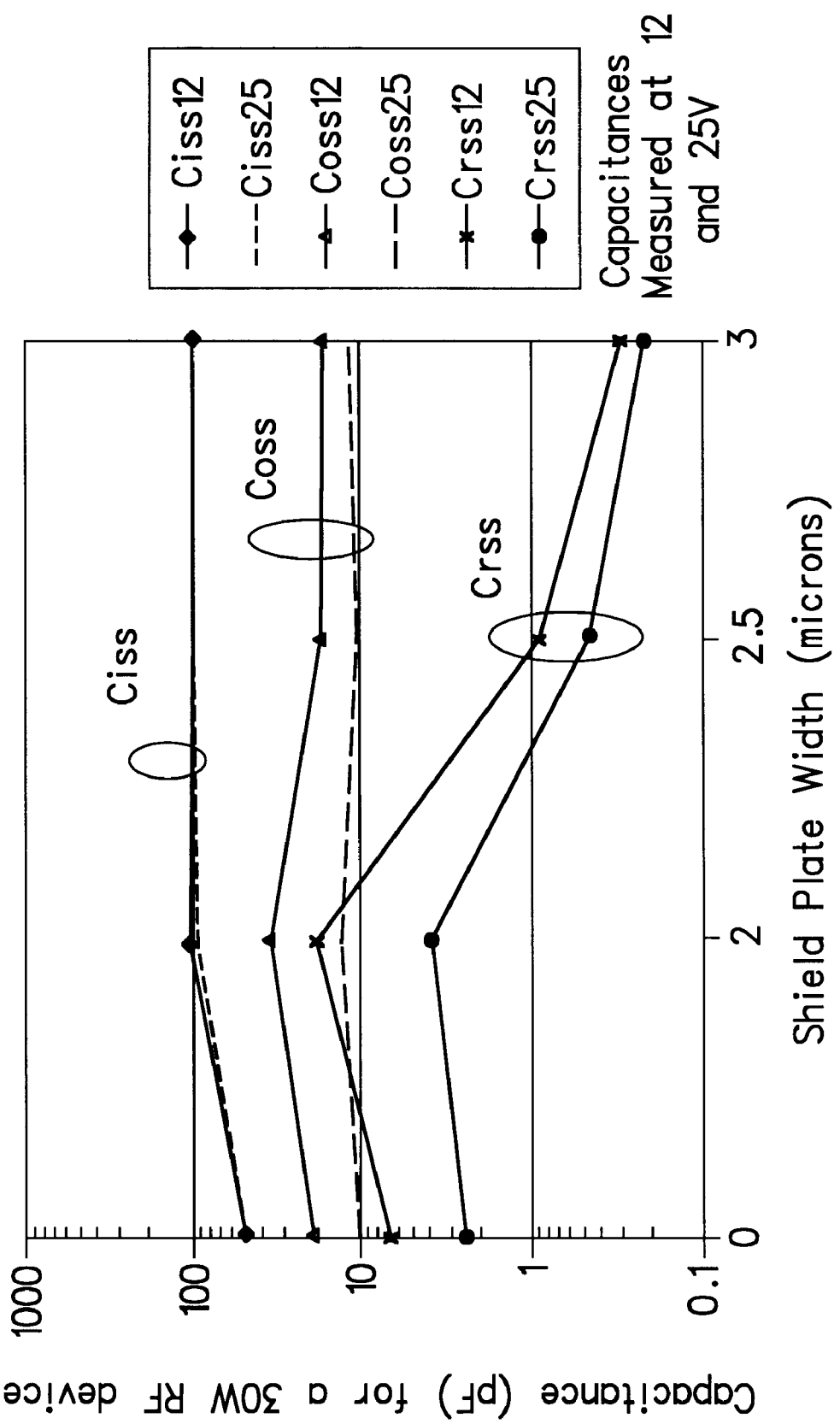
FIG. 17 is a graph illustrating the effect of shield plate width on device capacitances for a 30 watt RF power device.

The effect of field plate width on the various capacitances (in pF) for a 30 watt RF device is plotted in FIG. 17. FIG. 17 and the above table indicate that the shield plate must be wider than the gate.

Two dimensional computer simulations of the same structure with and without the buried shield plate assume 0.2 $\mu$m oxide under and 0.1 $\mu$m oxide on top of the polysilicon buried shield plate. As much as a twenty times reduction in gate to drain capacitance was obtained.

There has been described several embodiments of vertical and lateral MOSFETS having buried shield plates between the gate and drain of the structures, and reductions in gate to drain capacitance has been demonstrated. While the invention has been described with reference to several embodiments, the description is illustrative of the invention and is not to be construed as limiting the invention. Various modifications and applications may occur to those skilled in the art without departing from the true spirit and scope of the invention as defined by dependent claims.

What is claimed is:

1. A field effect transistor having reduced gate to drain capacitance comprising:

a semiconductor body having a major surface, a source region of first conductivity-type abutting said surface, a drain region of said first conductivity-type abutting said surface and spaced from said source region with a channel therefrom, a gate overlying said channel and part of said drain and insulated from the channel and the drain by a dielectric material, and a shield plate positioned beneath said gate and between said gate and said drain and insulated from the gate and the drain by a dielectric material.

2. The field effect transistor as defined by claim 1 wherein said shield plate comprises a conductor selected from the group consisting of polysilicon, polycide, silicide, salicide, and refractory metals.

3. The field effect transistor as defined by claim 1 wherein said field effect transistor comprises a lateral field effect transistor.

4. The field effect transistor as defined by claim 1 wherein said field effect transistor comprises a vertical field effect transistor.

5. The field effect transistor as defined by claim 1 wherein said shield plate includes a contact for electrically biasing the shield plate.

6. The field effect transistor as defined by claim 5 wherein said field effect transistor comprises a lateral field effect transistor.

7. The field effect transistor as defined by claim 5 wherein said field effect transistor comprises a vertical field effect transistor.

8. The field effect transistor as defined by claim 5 wherein said shield plate is coupled to an AC ground.

9. The field effect transistor as defined by claim 8 wherein said shield plate is connected to a DC voltage potential.

10. The field effect transistor as defined by claim 5 wherein said shield plate is connected to a DC voltage potential.

11. The field effect transistor as defined by claim 5 wherein said contact is above said shield plate and provides lateral capacitive isolation between said gate and said drain.

12. The field effect transistor as defined by claim 1 wherein said transistor comprises a RF power amplifier.

13. The field effect transistor as defined by claim 1 wherein said shield plate includes a raised portion which provides lateral capacitive isolation between said gate and said drain.

14. The field effect transistor as defined by claim 1 and further including a metal source contact, said metal source contact extending over and above said gate to provide capacitive isolation between said gate and said drain.

15. The field effect transistor as defined by claim 14 wherein said metal source contact extends to and contacts said shield plate.

* * * * *